United States Patent [19]

Yilmaz et al.

[11] Patent Number: 4,794,432
[45] Date of Patent: Dec. 27, 1988

[54] MOSFET STRUCTURE WITH SUBSTRATE COUPLED SOURCE

[75] Inventors: Hamza Yilmaz, Raleigh; King Owyang, Carrboro; Robert G. Hodgins, Raleigh, all of N.C.

[73] Assignee: General Electric Company, Somerville, N.J.

[21] Appl. No.: 7,034

[22] Filed: Jan. 27, 1987

[51] Int. Cl.$^4$ ................. H01L 29/78; H01L 27/02
[52] U.S. Cl. ............................ 357/23.4; 357/23.8; 357/86; 357/41
[58] Field of Search ............. 357/23.8, 23.4, 86, 357/38 T, 41

[56] References Cited

U.S. PATENT DOCUMENTS

| | | | |
|---|---|---|---|
| 4,345,265 | 8/1982 | Blanchard | 357/23.8 |
| 4,414,560 | 11/1983 | Lidow | 357/86 |
| 4,443,931 | 4/1984 | Baliga et al. | 357/86 |
| 4,613,766 | 9/1986 | Patalong | 357/86 |

FOREIGN PATENT DOCUMENTS 59-21065 2/1984 Japan ................. 357/23.4

OTHER PUBLICATIONS

"A New MOS-Gate Bipolar ... High Current Capability", S.S.D. and MAT. Conf, Tokyo 1985, pp. 389-392.
"A Quantitative Study ... Sipmos Transistors", J. Tihanyl, Siemens Forsch-u Entwickl-Ber, vol. 9, No. 4, 1980, pp. 181-189.

Primary Examiner—Martin H. Edlow
Assistant Examiner—Donald J. Featherstone
Attorney, Agent, or Firm—Stanley C. Corwin; Kenneth R. Glick

[57] ABSTRACT

A disclosed MOSFET cell has a source region formed at the top surface of a semiconductor substrate. The top surface source region is electrically coupled to a conductive region at a bottom portion of the substrate by means of a vertical conduit which projects through the substrate from the top surface to the conductive region. A current exchanger is provided extending over the top surface of the substrate and coupling a top surface portion of the vertical conduit to the source region. The current exchanger makes ohmic contact with the source region and with the conduit region and shorts the two regions together such that majority carrier current of the conduit region will be "converted" into majority carrier current of the source region and electrical continuity between the source region and the conductive region of the substrate is established. Respective source regions of multiple MOSFET cells may be interconnected in accordance with this method through a longitudinally extending conductive layer which is typically formed near the bottom surface of semiconductor substrates.

9 Claims, 4 Drawing Sheets

MOSFET STRUCTURE WITH SUBSTRATE COUPLED SOURCE

BACKGROUND OF THE INVENTION

1. Field of the Invention

The present invention relates in general to integrated circuits and in particular to an integrated circuit structure in which respective gate and drain portions of a plurality of MOSFET cells are accessible through a top surface of a lateral structure.

2. Description of the Prior Art

Insulated gate devices such as power metal-oxide-semiconductor field-effect transistors (or MOSFETs) often comprise a plurality of interconnected cells distributed laterally over a top surface of a substrate, where each cell includes a source, channel and drain region arranged laterally along the top surface. The source regions are typically interconnected by a metallization layer overlying the top surface of the device. Such top surface interconnection can increase the cost of the insulated-gate device and utilize surface area which could be used for other structures.

FIG. 1 is a cross sectional view of a previous design in which plural identical MOSFET cells are fabrccated laterally along the top surface of a substrate 1 and are connected to external circuitry by ohmic contacts bonded to the top surface. Two such MOSFET cells are indicated at 10 and 20, respectively. The first MOSFET cell 10 includes a substrate-well contact 11 which is connected to a source terminal $S_1$ through a first opening 17a provided in an insulating layer 17. One portion of the substrate-well contact 11 attaches to a p-type substrate contact region 15a at the top of a double diffused substrate-well 15. A second portion of the substrate-well contact 11 is bonded to the top of a n-type source region 16. A connecting region 15b extends laterally under the source region 16 from the substrate contact region 15a to a p-type channel region 15c which terminates at the top surface of the substrate 1. A silicon dioxide insulating layer 17 covers the channel region 15c and supports a polysilicon gate 18. The gate 18 is accessed by a gate terminal $G_1$ extending upwardly from a gate contact 12. A drain terminal $D_1$ rises vertically through a second opening 17b in the insulating layer 17 from a drain contact 13 that is bonded to the heavily doped (n+) surface of an n-type drain region 14. Contacts 11 and 13 are typically made of a metal such as a aluminum which bonds readily to the heavily doped surfaces of respective regions 15a, 16 and 14 and provides ohmic contact a the metal-semiconductor junctions.

The second MOSFET cell 20 is comprised of identical parts including a substrate-well contact 21 that is accessed through another opening 17c in the insulating layer by a second source terminal $S_2$. A second gate contact 22 is provided coupled to a second gate terminal $G_2$. A second drain contact 23 is accessed through the insulating layer 17 (opening 17d) by a second drain terminal $D_2$. The substrate 1 also includes a drift region 2 (n−), portions of which project to the top surface between the channel and drain regions of each MOSFET cell; an epitaxial layer 3 (p−−), a bulk layer 4 (p+) and a substrate contact 5 at the bottom surface of the substrate as shown in FIG. 1. The substrate contact 5 is typically coupled to ground through a substrate terminal SBST.

In many previous circuits, the first and second source terminals, $S_1$ and $S_2$ are connected to a common point, such as ground, by a conductive metallization layer represented by a ground bus 30 in FIG. 1. This metallization layer is often insulatively disposed over the top surface of the device and connected to individual source regions through openings (e.g. the first and third openings, 17a and 17c) provided in one or more insulating layers. As previously mentioned, this arrangement can increase the cost of the device and also utilize space needed for other structural features.

For situations where multiple semiconductor cells, such as MOEFET cells 10 and 20 of FIG. 1, are dispersed across the entire face of an integrated circuit chip (IC), it is often necessary to provide a plurality of inter-cell coupling layers which span across and consume major portions of the surface area available at the top of the IC. The inter-cell coupling layers are typically formed in separate fabrication steps wherein a first insulation layer (e.g. oxide layer) is deposited on the top face of the IC, through-holes are etched at required locations to permit connection to semiconductor regions of the substrate, a first metal layer (e.g. aluminum) is deposited on the first insulation layer in a predetermined pattern to connect selected substrate regions one to the other, a second insulation layer is deposited over the first metal layer, through-holes are etched in accurate alignment with the through holes of the first insulation layer, and a second metal layer is deposited across the top face of the IC to provide additional intercoupling of cells dispersed aross the IC. The deposition of each set of metal connecting layer and oxide insulating layer adds to the cost of the final IC and increases the probability that a fault will develop during fabrication thereby lowering the manufacturing yield. An inter-cell coupling arrangement which obviates the need for at least one set of metal and insulating layers would reduce cost, increase manufacturing yield, and permit denser circuit packing by freeing chip surface areas previously occupied by the prior art through-hole connections provided through the insulation layers for accessing the top surface of the semiconductor substrate.

SUMMARY OF THE INVENTION

Inter-cell coupling layers such as the above mentioned conductive metallization layer 30 consume an appreciable portion of the top surface area available on a substrate. Often they must extend laterally across major portions of the top surface of the substrate to interconnect laterally dispersed portions of individual semiconductor cells. It is an object of the present invention to obviate the need for at least one of these top surface inter-cell coupling layers.

In accordance with one embodiment of the present invention, inter-cell coupling is provided by a conductive bottom layer of the substrate. Connection to the conductive bottom layer of the substrate is made by an intra-substrate coupling structure which, in the illustrated embodiment, includes a vertical conduit region of a first conductivity type projecting through the substrate from a top surface portion to contact a conductive bottom layer of the same conductivity type, and a current exchanger which couples the vertical conduit region to a second region of an opposed conductivity type that is located at the top surface of the substrate. The current exchanger exchanges one type of charge carrier (e.g. holes) for an opposed type of charge carrier (e.g. electrons) to thereby establish continuous current flow between the conduit region and the second region which is of an opposed conductivity type. The need for a top surface interconnection layer to couple two or more top surface regions like the second region is thereby obviated.

BREIF DESCRIPTION OF THE DRAWINGS

DETAILED DESCRIPTION

Previously, inter-cell coupling has generally been provided by metallization layers on the top surace of semiconductor substrates. Separate processing steps are often needed to fabricate each metallization layer. Each processing step adds to the cost of the final product. Furthermore, openings have to be accurately positioned and bored (etched) through top surface insulating layers to provide the metallzation layers with access to the substrate's semiconductor regions In accordance with the present invention the bottom portion of a semiconductor substrate is used to interconnect commonly coupled top surface regions of an integrated circuit. A carrier converting layer (current exchanger), preferably made of refractory metals such as tungsten, is provided at the top surface of the substrate to couple top surface regions having a first conductivity type, which is opposed to a second conductivity prevelant in a bottom portion of the substrate, to the bottom portion.

The top surface regions of the first conductivity type may be for example, respective n-type source regions of a plurality of MOSFET cells. Substrate-well regions of the MOSFET cells can be deep-diffused into the substrate to provide a vertical connecting region or conduit of the second conductivity type (e.g. p-type conductivity) linking a conductive bottom layer (e.g. a p-type bulk layer) to the top surface of the substrate.

A carrier converting layer or "current exchanger" can be provided at the top surface of the substrate to couple the top surface regions (e.g. source regions) to the vertical conduit. The current exchanger converts majority charge carrier current (e.g. holes) passing through the vertical conduit into an opposed type of charge carrier current (e.g. electrons) which can readily pass into the top surface regions of the first conductivity type (e.g. n-type conductivity).

In one application of the intra-substrate coupling concept of the present invention, an insulated gate device such as a power MOSFET having a corresponding plurality of source regions dispersed over the top surface of a semiconductor substrate is provided with a plurality of current exchange plates. Each current exchange plate is connected to a source region of a respective MOSFET cell. The plurality of current exchange plates couple their respective source regions to a bottom conductive portion of the substrate through one or more vertical conduit regions. The vertical conduit regions project downwardly from the top surface of the substrate to a conductive layer (which can be a heavily doped semiconductor layer or a metal layer) extending across a bottom portion of the substrate. In this manner, dispersed source regions of a plurality of MOSFET cells may be interconnected along the bottom of the substrate without use of an inter-cell metallization layer overlaying the top surface of the device.

Figure 1:
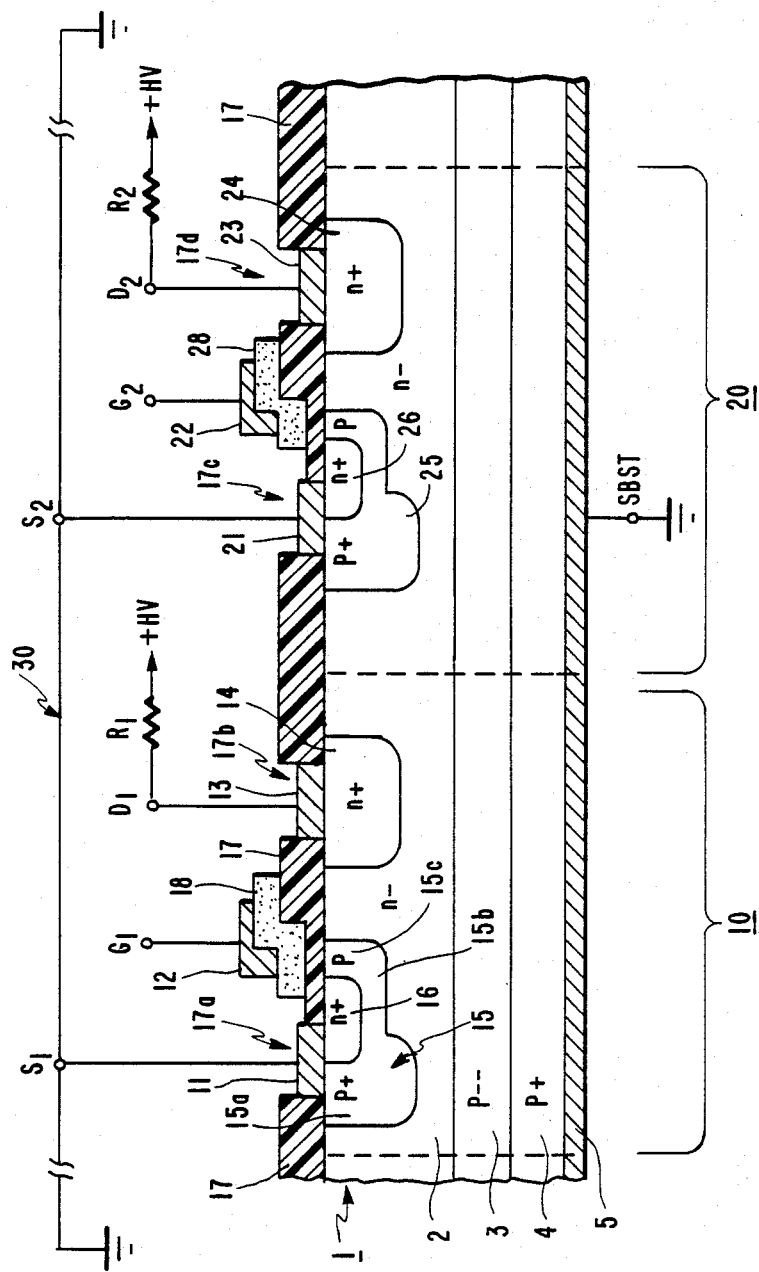
FIG. 1 is a cross-sectional view of a known MOSFET cell interconnect arrangement.
Figure 2:
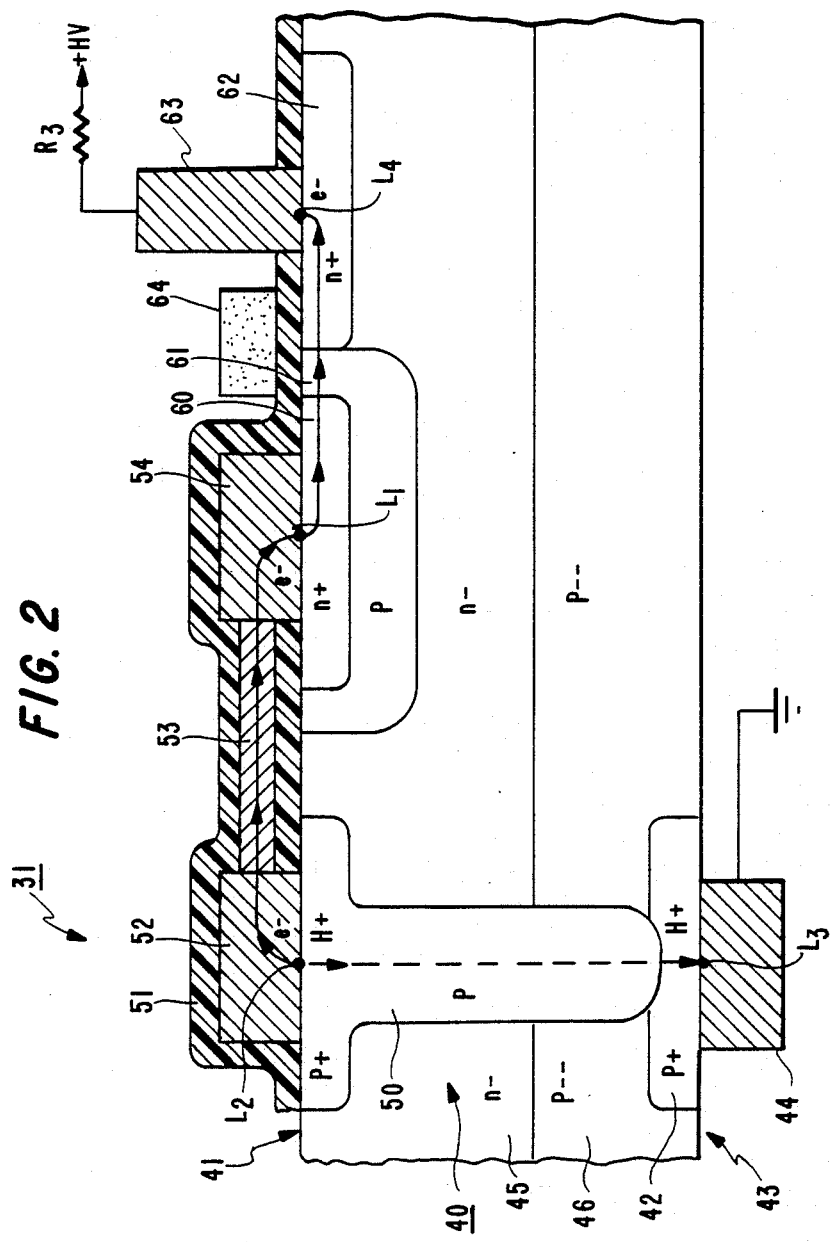
FIG. 2 is a cross-sectional view of an intra-substrate coupling arrangement according to the present invention.

FIG. 2 is a cross-sectional view of an intrasubstrate coupling structure in acoordance with the present invention. The illustrated intra-substrate coupling structure, indicated generally at 31, provides electrical communication between a first contact location $L_1$ at the top of a substrate 40 and another contact location $L_3$ at the bottom of the substrate 40 via an intermediate contact location $L_2$ also located at the top of the substrate. The illustrated coupling structure 31 includes a bottom electrode 44, attached to the bottom surface 43 of the substrate 40, and a vertical conduit region 50 (deep diffused p-well) projecting through the substrate from the top surface 41 of the substrate to a bottom conductive region 42 (p+).

A first top surface region 60 of a first conductivity type (n+) is provided at one portion of the top surface 41 of the substrate. The conduit region 50 is doped oppositely (p+) such that it readily conducts charge carriers of a second conductivity type between the intermediate and bottom contact locations, $L_2$ and $L_3$. Specifically, in the illustrated embodiment, the conduit region 50 is fabricated by a deep-diffused p-well whose majority carriers are holes (H+) and the first top surface region 60 is an n-type shallow diffused well (source region) of an insulated gate device that conducts electrons (e−) when activated (e.g. an n-channel MOSFET). A "carrier converting" electrode 52 makes ohmic contact with the conduit region 50 at the intermediate contact location $L_2$ such that hole current H+ in the conduit region 50 can be exchanged for electron current e− in the carrier converting electrode 52. A lateral shorting layer 53 shorts the intermediate contact location $L_2$ a second electrode 54 which makes ohmic contact with the n-type first top surface region 60 at the first contact location $L_1$. An electrode insulator 51 covers the intra-substrate coupling structure 31 to insulate it from other conductive layers which can be placed, if desired, on the surface area available above the carrier converting electrode 52, shorting layer 53 and second electrode 54.

As noted, one ohmic contact forms at location $L_2$ where the vertical conduit 50 meets the carrier converting electrode 52. Another ohmic contact forms at the first contact location $L_1$ where the second electrode 54 attaches to the first top surface region 60. The first region 60 (n+) is embedded in an oppositely doped p-type well 61. An insulated gate 64 is insulatively supported above a channel portion of the p-type well 61 by a lateral extension of the electrode insulator 51. A lateral field electrode 63 attaches to a top surface access region 62 (n+) of the substrate 40 through an opening provided in the electrode insulator 51. A potential +HV can be applied as shown to the lateral field electrode 63 through a load $R_3$ to induce an electric field from the first contact location $L_1$ through the substrate 40 between the bottom electrode 44 and the top surface 41. Electrons will be attracted by a lateral portion of the induced electric field to a fourth contact location $L_4$. Holes will be urged vertically by a vertical portion of the electric field from the second contact location $L_2$ to the third contact location $L_3$.

The carrier converting electrode 52 is preferably formed integrally with the shorting layer 53 and second electrode 54 as a single carrier converting layer 52–54 that includes a material which forms ohmic contacts at contact locations $L_1$ and $L_2$, and shorts the two contact locations electrically. A low temperature metal, such as aluminum can be used, however, a high temperature refractory metal such as tungsten, molybdenum, or titanium is preferred. When a refractory metal is used, a relatively thick (1 micron or more) insulating layer 51 can be deposited over the single layer 52–54 by known high temperature insulating techniques. The insulating layer 51 is preferably formed of an oxide that has a dielectric strength equal to or greater than 50 volts so a high voltage metal layer can be deposited on the insulating layer 51 thereby utilizing available surface area above the carrier converting layer 52–54.

The carrier converting electrode 52 "converts" (transforms) majority carrier current (holes $H^+$) flowing through the vertical conduit region 50 into an opposed type of majority carrier current (electrons $e^-$) which can flow through the n-type first top surface region 60. In the illustrated embodiment, the current conversion process utilizes ohmic contacts at respective top surface locations $L_1$ and $L_2$, and the creation of an electrical short between the two ohmic contacts to provide electrical continuity between locations $L_1$ and $L^3$. The hole current ($H^+$) flows vertically through the vertical conduit region 50 (p-type semiconductor) and the electron current ($e^-$) flows through the first region 60 (n-type semiconductor) at the same time. This establishes a current continuity between the bottom p-type region 42 and the n-type first region 60 in spite of their opposed conductivity types. A desired reverse bias at the junction of the lightly doped epitaxial regions 45 (n−) and 46 (p− −) of the illustrated substrate can be maintained generally intact.

Figure 3:
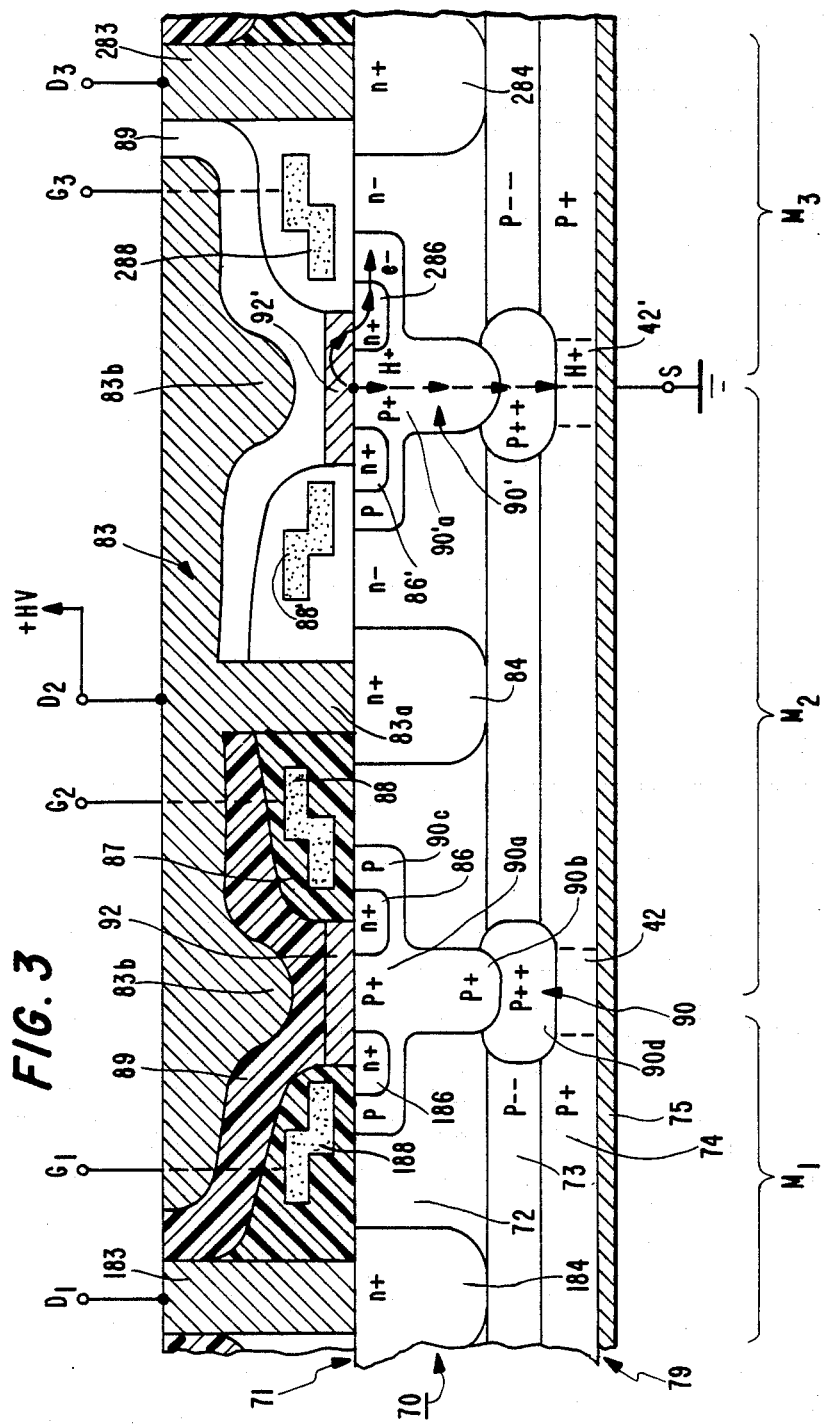
FIG. 3 is a cross-sectional view of a MOSFET cell with substrate coupled source regions.

FIG. 3 shows an example of an MOSFET cell arrangement incorporating an intra-substrate coupling structure in accordance with the present invention. The deep-diffused p-well of FIG. 2 has been merged with the substrate-well of the MOSFET to provide an integrated arrangement in which, as will be described, ohmic contacts at the top surfaces of the source regions (n-type) and substrate-wells (p-type) are provided by one or more metal slugs 92, 92′. The MOSFET cell is embedded in a substrate 70 which includes a lightly doped electron drift region 72 (n−). The electron drift region 72 is fabricated in facing contact with a lightly doped epitaxial layer 73 (p− −). A heavily doped substrate bulk layer 74 (p+) and a conductive metal contact plate 75 extend laterally along the bottom surface 79 of the substrate 70. It will be apparent by comparison with FIG. 2 that the bottom conductive region 42 of FIG. 2 is in essence, integrally included within the substrate bulk layer 74 of FIG. 3 and the bulk layer 74 inherently provides an interconnection between a plurality of integrally incorporated bottom conductive regions 42, 42′. Bottom electrode 44 (FIG. 2) is similarly included into the contact plate 75 of FIG. 3.

A number of n-type source regions 86, 186 and 286 aare dispersed across the top surface 71 of the substrate 70. A set of complementary n-type drain regions 84, 184 and 284 are also distributed along the top surface of the substrate. Three metallized drain layers 83, 183 and 283 couple drain regions 84, 184 and 284 to respective drain terminals $D_2$, $D_1$, and $D_3$. An $SiO_2$ insulating layer 87 supports a number of polysilicon gates 88, 188 and 288 insulatively above the top surface 71 of the substrate. The polysilicon gates are respectively coupled to external circuitry above the structure by gate terminals $G_1$, $G_2$, and $G_3$. A high voltage $Si_3N_4/SiO_2$ insultating layer 89 is deposited over the metal slugs 92, 92′ to insulatively support lateral portions of the central drain metallization layer 83 above the top surface of the slugs 92, 92′.

The metal slugs (carrier converter plates) 92, 92′ are preferably made of a refractory metal. They are disposed on the top surface 71 of the substrate, in a manner such that each makes ohmic contact with respective source regions 86, 186 and 286 while simultaneously making ohmic contact with electrode contact regions 90a, 90a′ (p+) emerging at the top surface of vertical conduit areas 90, 90′. The vertical conduit areas 90, 90′ are deep-diffused p-type areas that include a bulk penetrating region 90b (p+) and an epitaxial penetrating region 90d (p+ +). The epitaxial penetrating region 90d projects through the epitaxial layer 73 (p+ +) to provide a low resistance link to the conductive substrate bulk layer 74 (p+). Lightly doped p-type channel regions 90c extend from respective core portions of the vertical conduit areas 90, 90′ to top surface areas of the substrate which are insulatively situated directly below respective polysilicon gates 88, 188 and 288.

As will be appreciated by those skilled in the art, numerous variations in top view geometry are possible for the structure shown in FIG. 3. The top view geometry could include symmetries about the central drain region 84 and/or symmetries about the illustrated left and right vertical conduit areas 90 and 90′. If top view symmetry exists for example, around the vertical conduit area 90 shown at the left side of FIG. 3, the polysilicon gate 188 can be formed separate from or integrated with the polysilicon gate 88. Likewise, the top view geometry can be modified so the left carrier converter plate (slug) 92 of FIG. 3 is fabricated separate from or integrated with the right carrier converter plate (slug) 92′ of FIG. 3. The numerous variations that will become apparent to those skilled in the art need not be fully discussed herein.

The metallized drain electrode layer 83 has a first vertical projection 83a descending through openings provided in the insulating layers 87 and 89 to the top surface of the substrate to contact the heavily doped drain region 84. If a single step process is used to fabricate the $Si_3N_4/SiO_2$ insulating layer 89 above the converter plate 92, a second descending projection 83b typically forms at a lateral portion of the drain electrode 83, dropping toward but remaining insulated from the carrier converter plate 92. When a relatively high voltage +HV is applied to the drain terminal $D_2$, a large electric field will develop between the second vertical projection 83b of the drain electrode 83 and the carrier converter plate 92. The $Si_3N_4/SiO_2$ insulating layer 89 that insulates the carrier converter plate 92 from the second projection 83b is preferably made as thick as economically possible to prevent high voltage arcing from the drain metal layer 83 to the substrate contact plate 75 directly through the carrier converter plate 92 and the vertical conduit area 90.

The carrier converter plate 92 will generally float at a voltage between that existing at the bottom metal contact plate 75 and the source regions 86, 186, 286. When the channel regions 90c conduct, a lateral electric field will form between the carrier converter plates 92, 92′ and the drain regions 84, 184, 284 to urge n-type majority charge carriers ($e^-$) laterally from the carrier coverter plates 92, 92′ into the source regions 86, 186 and 286 such that the source regions are supplied with a stream of electrons.

By way of illustration, it will be assumed that top view symmetry exists about the center drain region 84 and further that the peripheral source regions 186 and 286 are formed separate from the central source region 86. It is well understood that the structure of FIG. 3 can be used to form a plurality of cells with a top view geometry that is rectangular, pie-shaped, etc. and repeats over the top surface of the substrate. Using the top view geometry selected above, the MOSFET cell shown in FIG. 3 can be divided into three MOSFET devices, M1, M2 and M3. An equivalent circuit of the three devices is shown in FIG. 4 with an additional MOSFET device M4 added on the right to explain how source regions of adjacent cells are coupled through the substrate according to the present invention.

It will be assumed that a relatively large positive voltage +HV is applied to drain terminal $D_3$. When a positive gate voltage is applied to the gate terminal $G_3$ of the third MOSFET device M3, an n-channel will be induced in the channel region directly below polysilicon gate 288. Electrons ($e^-$) can then flow through the induced n-channel to the positively charged drain electrode 283 by passing throught the lightly doped drift layer 72 (n−) and the heavily doped drain region 284 (n+). At the same time, holes $H^+$ will be free to drift from the surface of the carrier converter plate 92 toward the grounded substrate contact plate 75 through the vertical conduit area 90. As long as the induced n-channel remains open, the carrier converter plate 92 will float at a voltage above that of the grounded substrate plate 75 and an electric field will exist between the converter plate 92 and the sustrate contact plate 75 to urge holes ($H^+$) toward the substrate contact plate 75. When the positive voltage at the gate terminal $G_3$ is removed, the induced n-channel will collapse and electron flow ($e^-$) between the carrier converter plate 92 and the drain electrode 283 will cease. Positive charge carriers $H^+$ will continue to move away from the carrier converter plate 92 until the voltage of the carrier converter plate 92 drops to a level substantially near that of the substrate contact plate 75, at which point significant hole conduction $H^+$ through the vertical conduit area 90 will also stop.

As indicated earlier, the carrier converter plate 92 may be formed of materials which readily form ohmic contacts with top surface contact area of the vertical conduits and regions of oposed conductivity and create an electrical short between the two contact areas. The converter is preferably composed of a refractory metal such as tungsten.

Figure 4:
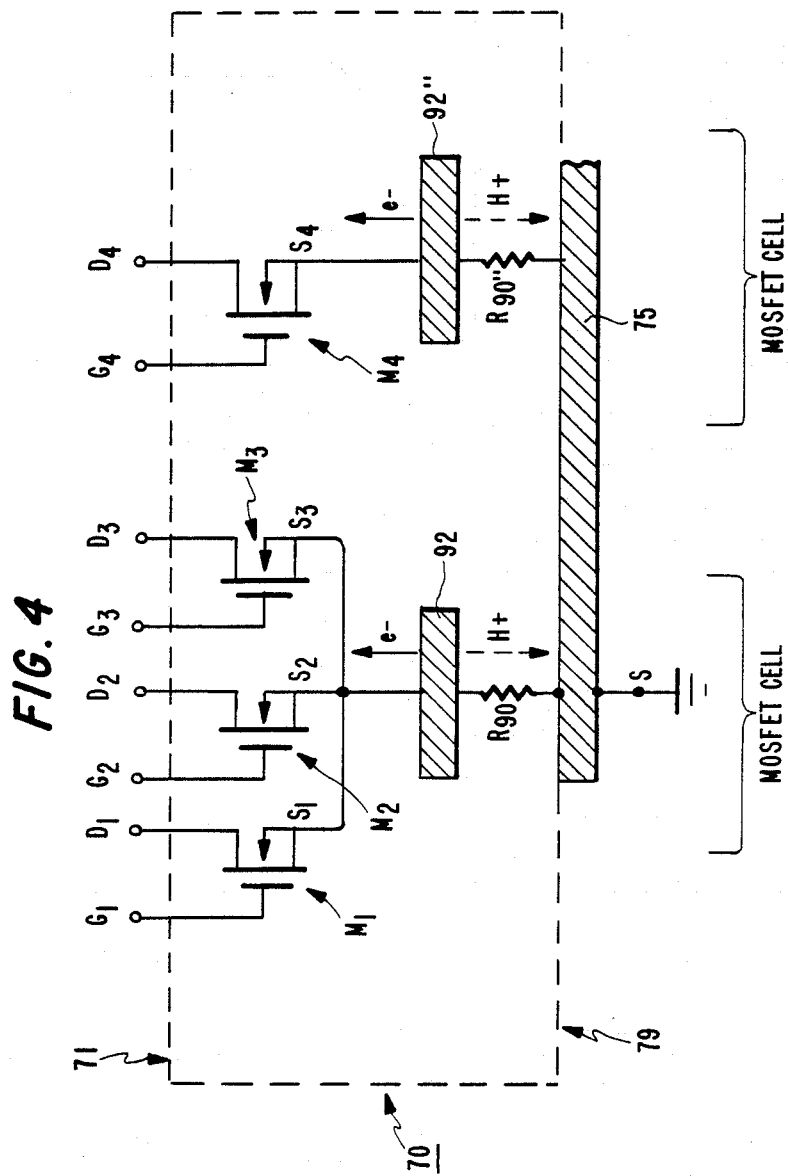
FIG. 4 is a schematic diagram of one possible structure having the cross section shown in FIG. 3.

In the schematic representation of FIG. 4, the carrier converter plate 92 is assumed to be an integral structure contacting source regions 186 ($S_1$), 86 ($S_2$), and 286 ($S_3$) of respective MOSFET devices M1, M2, and M3. The carrier converter plate 92 also contacts the top surface region of a vertical conduit area 90. In the adjacent MOSFET cell (M4), an identical carrier converter plate 92″ couples a fourth source region $S_4$ to another vertical conduit area 90″. The gate terminals $G_1, G_2, \ldots, G_4$ and drain terminals $D_1, D_2, \ldots, D_4$, are accessible through the top surface 71 of the substrate structure. The source regions of each device, $S_1, S_2, \ldots, S_4$ are on the other hand coupled to a common substrate terminal S through the bottom surface conductive plate 75. $R_{90}$ is the drift resistance presented to holes $H^+$ travelling down through conduit area 90. $R_{90}″$ represents the resistance of the second conduit area 90″ of the adjacent MOSFET cell coupling the source of M4 to ground. The adjacent MOSFET cell (M4) includes a second carrier converter 92″ attached to the corresponding second vertical conduit area 90″. Source region $S_4$ is therefore coupled to $S_1$, $S_2$ and $S_3$ through $R_{90}$, conductive layer 75, and $R_{90}″$.

In previous structures, the source regions were interconnected through metallized layers insulatively formed above the top surface of the substrate. By contrast, the present invention eliminates the need for any connection to the source contacts at the top surface of the substrate and eliminates the various steps needed during manufacture to join these contacts, including for example, formation of openings in an insulating layer to access the top surface of the substrate. An integrated circuit that is fabricated according to the present invention will not require source terminal leads extending from its top surface and will therefore permit increased device concentration within a given area of substrate surface and reduced manufacturing cost.

It will, of course, be understood that modifications of the present invention, in its various aspects, will be apparent to those skilled in the art, some being apparent only after study and others being merely matters of routine electronic design and device fabrication. For example, obvious modifications include: interchanging the p and n regions to make a device of opposite polarity, forming a lateral insulated gate transistor (LIGT) by embedding an emitter region (p+) in region 84 so metal projection 83a becomes an emitter terminal, and employment of the carrier converter in other structures where electrical interconnection through a substrate between a bottom region made of one type semiconductor and a top region made of an opposite type semiconductor is desired. Other embodiments are also possible, with their specific designs being dependent upon the particular application. As such, the scope of the invention should not be limited by the particular embodiment herein described but should be defined only by the appended claims and equivalents thereof.

We claim:

1. A lateral MOSFET cell structure comprising:
   a substrate having a top surface and a bottom surface;
   a first layer of first conductivity type across the bottom surface and a relatively lightly doped epitaxial layer of second conductivity type disposed on the first layer and extending to the top surface;
   a source region of second conductivity type, a channel region of first conductivity type, and a drain region of second conductivity type, laterally disposed in said order at the top surface of the substrate, said source and drain regions being more heavily doped than said epitaxial layer;
   a conduit region of first conductivity type, contiguous with the channel region, projecting from the top surface of the substrate, through the epitaxial layer, to form a generally vertical conduit communicating between the top surface of the substrate and portions of the substrate below the epitaxial layer;
   a source electrode on the bottom surface, in contact with the conduit region; and
   carrier conversion means linking a top surface portion of said source region to a top surface portion of said conduit region.

2. A MOSFET cell structure according to claim 1 further comprising an insulating layer disposed over said carrier conversion means; and a metallization layer disposed over the insulating layer.

3. A MOSFET cell structure according to claim 2 wherein said insulating layer extends over said channel region, and wherein the MOSFET cell structure further comprises an insulated gate supported above said channel region by said insulating layer.

4. A MOSFET cell structure according to claim 2 wherein said insulating layer includes a $Si_3N_4/SiO_2$ sublayer.

5. A MOSFET cell structure according to claim 1 wherein said carrier conversion means includes a refractory metal layer.

6. A MOSFET cell structure according to claim 1 wherein said channel region extends from said conduit region to the top surface of said substrate.

7. A MOSFET cell structure according to claim 1 wherein said source, drain, channel, and conduit regions are one or the second type of p-type and n-type semiconductors, said source region and drain region being of said one type, and said channel region and conduit region being of the second type.

8. A MOSFET cell structure according to claim 7 wherein said epitaxial layer is of the same semiconductor type as said conduit region and said conduit region is heavily doped relative to said epitaxial region.

9. A plurality of MOSFET cell structures according to claim 1 integrated on a single substrate that includes a conductive bottom surface, wherein respective conduit regions of each MOSFET cell structure communicate with the conductive bottom surface of the substrate such that respective source regions of said plurality of MOSFET cell structures are electrically interconnected through the conductive bottom surface of the substrate.

* * * * *